United States Patent [19]

Matsunaga

[11] Patent Number: 5,053,872
[45] Date of Patent: Oct. 1, 1991

[54] SOLID STATE CAMERA DEVICE HAVING FREE CARRIER ABSORPTION

[75] Inventor: Yoshiyuki Matsunaga, Kanagawa, Japan

[73] Assignee: Kabushiki Kaisha Toshiba, Kawasaki, Japan

[21] Appl. No.: 514,035

[22] Filed: Apr. 27, 1990

[30] Foreign Application Priority Data

Aug. 31, 1989 [JP] Japan .................. 1-222903

[51] Int. Cl.$^5$ .......................................... H04N 5/335
[52] U.S. Cl. ...................... 358/213.11; 358/213.19;
358/113; 358/213.31; 358/213.23; 357/24 LR
[58] Field of Search ................ 358/213.11, 213.12,
358/213.23, 213.13, 213.15, 213.16, 213.17,
213.18, 213.22, 213.19, 213.24, 213.25, 213.26,
213.27, 213.28, 213.29, 213.3 N, 113; 357/24
LR, 24 M, 30 H

[56] References Cited

U.S. PATENT DOCUMENTS

| 4,589,027 | 5/1986 | Nakamura | 358/213.12 |
| 4,611,223 | 9/1986 | Hine | 358/213.19 |
| 4,665,422 | 5/1987 | Hirao | 358/213.12 |
| 4,696,021 | 9/1987 | Kawahara | 357/24 LR |
| 4,831,453 | 5/1989 | Takemura | 358/213.19 |
| 4,851,915 | 7/1989 | Yang | 358/213.31 |
| 4,952,995 | 8/1990 | Phillips | 357/24 LR |

FOREIGN PATENT DOCUMENTS

0294183 11/1988 Japan .

Primary Examiner—Howard W. Britton
Assistant Examiner—Sherrie Hsia
Attorney, Agent, or Firm—Foley & Lardner

[57] ABSTRACT

A solid state imaging device based on free carrier absorption includes a photodiode in which free charges are filled, a transfer electrode which outputs the free charges to a channel region, a transmission electrode by which the free charges stored in the channel region are read out and transferred to outside, and an injection electrode and source region for setting a state in which the photodiode is filled with the free charges as a result of providing the free charges therein. The free charges in a conduction band in accordance with incident light irradiated into the photodiode become in an active state by plasma absorption and then transferred to the channel region under control of the transfer electrode. In addition to the above mentioned composition, a solid state imaging device is made up of two channel region in relation to a picture element of the photodiode. The two channel regions accumurate signal charges activated by the plasma absorption and another-type signal charges having inverse feature against the signal charges.

11 Claims, 6 Drawing Sheets

SOLID STATE CAMERA DEVICE HAVING FREE CARRIER ABSORPTION

BACKGROUND OF THE INVENTION

1. Field of the Invention

This invention relates to a solid state imaging device, and more particularly to a solid state imaging device based on free carrier absorption formed by silicon and having a capability of detecting incident light over a wide wavelength range.

2. Description of the Prior Art

Figure 1:
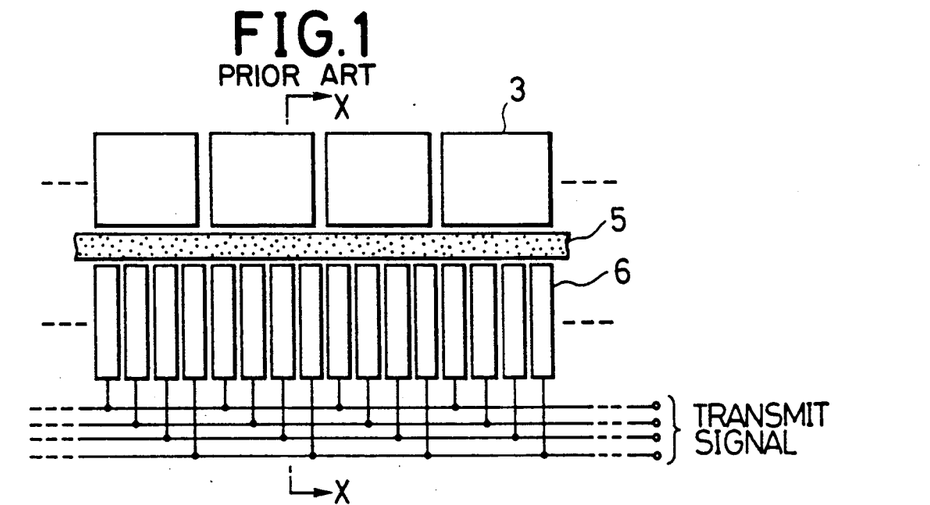
FIG. 1 is a plan view of a conventional solid state images device.
Figure 2A:
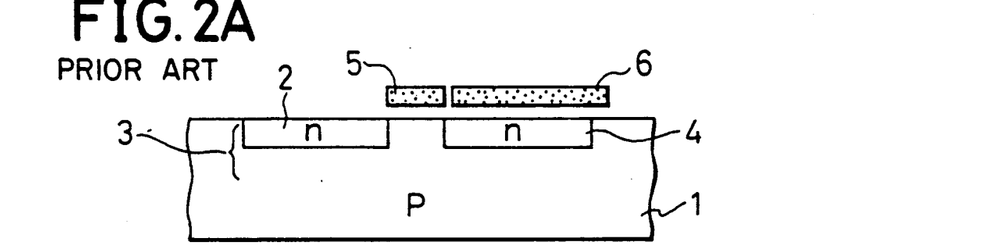
FIG. 2A is a cross sectional view along the X—X line in the solid state camera as shown in FIG. 1.
Figure 2B:
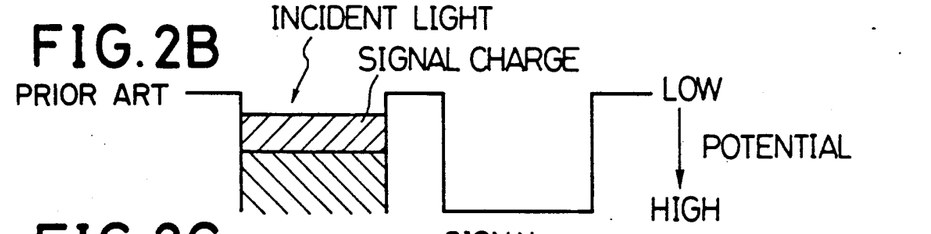
FIGS. 2B to 2D are potential energy views of FIG. 2A.
Figure 2C:
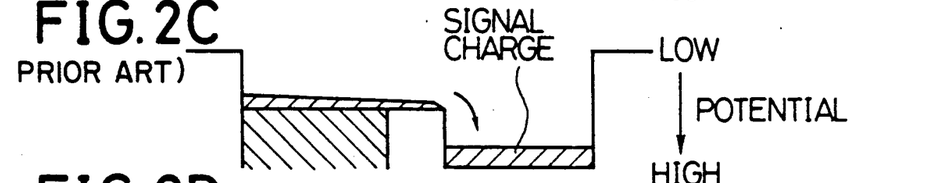
Figure 2D:
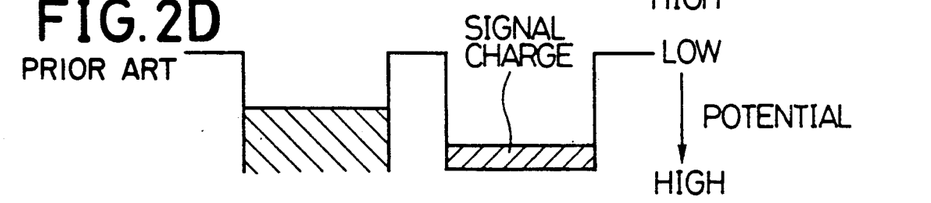

For example, there is a conventionally used a solid state camera device (including Charge Coupled Device: CCD) of a four-phase transfer type having a composition as shown in FIGS. 1 and 2A. FIG. 1 shows a plan diagram of the conventional CCD, and FIG. 2A shows a cross sectional view along the line X—X in the CCD as shown in FIG. 1. FIGS. 2B and 2D are potential energy diagrams of the CCD as shown in FIG. 2A.

In the FIGS. 1 and 2A, a plurality of first insulating region 2 having a predetermined distance between each other are formed on a surface portion of a P-type semiconductor substrate, such as a silicon substrate 1, and a plurality of photo diodes 3 formed with the insulating region 2 and the silicon substrate 1 are arranged as shown. On the substrate 1, a plurality of second insulating regions 4 as a charge transmit channel line 4 (channel region) of the CCD having a predetermined interval to each other are formed.

On the substrate 1 between the first insulating region 2 and the second insulating region 4, a transfer electrode 5 which transfers signal charges accumulated in the photodiode 3 to the channel region 4 (the second insulating reagion 4) is formed continually along a predetermined direction. Moreover, a plurality of transmit electrodes 6 are formed for transferring the signal charges outside of the solid state imaging device. Four transmit electrodes 6 are formed in a ratio of per a photodiode 3.

In the solid state camera device having the above mentioned composition, incident light is transformed photoelectrically in the photodiode 3. The signal charges transformed photoelectrically are proportional to the amount of incident light accumulated in the photodiode 3, as shown in FIG. 2B. Under the state in which a conduction band at P-N junction is poor in free electrons, the photodiode 3 catches the signal charges caused by a fundamental absorption, which means that electrons risen by absorption of the incident light are transferred from valence band to conduction band and then accumulated. When an electric-potential barrier formed between the photodiode 3 and the channel reagion 4 is increased to a high level by supplying a predetermined voltage to the transfer electrode 5, the signal charges accumulated in the photodiode 3 are transferred to the channel region 4, as shown in FIG. 2C. After the signal charges are transferred to the channel region 4, the electric-potential barrier of the transfer electrode 5 is decreased to a low level by stopping to supply voltage to the photodiode 3, as shown in FIG. 2D, so that the electric potential barrier is formed again in the region between the photodiode 3 and the channel region 4. While, the signal charges transferred in the channel region 4 are transferred to predetermined direction by continually supplying transfer signals to the transmit electrode 6, and then outputted outside of the CCD by a voltage-transform in an output circuit (not shown).

By operating the above mentioned way repeatedly, the incident light is transformed to signal charges by a light-electric transform method and then read out at the outside of the CCD.

As has been described, in the conventional CCD in which the incident light is transformed to signal charges by the light-electric transform method, the signal charges are generated by the transferring electrons from a conduction-band to a valence-band, namely triggering by the fundamental absorption of light in semiconductor. When the energy of incident light is only larger than that of a forbidden band in a semiconductor by which a photodiode is formed (generating signal charges and accumulating them), fundamental absorption occurs and signal charges are generated. Accordingly, in a case of such the photodiodes are formed by the P-N junction in the silicon such as the conventional CCD as shown in FIGS. 1 and 2A, incident light having an energy larger than a energy of a forbidden band width in silicon is only detected by the photodiode. Namely, there is a problem in that it is difficult to detect the incident light having a long wavelength more than 1 or 2 $\mu m$ by the conventional CCD.

SUMMARY OF THE INVENTION

This invention is invented in the light of the above problem, and an object thereof is to provide a solid state imaging device having a capability of detecting incident light over a wide-wavelength range. To achieve the above object, a first preferred embodiment of a solid state imaging a device according to the present invention comprises a light acceptable means for accepting incident light under a light acceptable state in which the light acceptable means is filled with free electrons during a light accepting period and outputting free charges as signal charges activated by energy based on a free-carrier absorption caused by the incident light, a store means for storing the signal charges applied from the light acceptable means, a transfer means for transferring the signal charge in the store means, and a setting means for setting the light acceptable means into the light acceptable state by providing them to the light acceptable means after the end of the light accepting period.

In the solid state imaging device of the embodiment, the incident light is accepted under the light acceptable state in which the light acceptable means is filled with free electrons and then free charges outputted from the light acceptable means by the free carrier absorption are read out. Accordingly the solid state imaging device having a capability of detecting light over widewavelength, such as lower photo energy, can be provided.

Another preferred embodiment of a solid state imaging device according to the present invention comprises a light acceptable means for accepting incident light under a light acceptable state in which the light acceptable means is filled with free electrons during a light accepting period and outputting free charges as signal charges activated by energy based on free-carrier absorption caused by the incident light and then exhausting part of the free electrons as signal charges after the end of the light accepting period, a first store means for storing the signal charges outputted during the light accepting period from the light acceptable means, a second store means for storing the signal charges exhausted from the first store means after end of the light accepting period, a transfer means for reading out the signal charges accumulated in the first and second store means and then transferring them, and a setting means for setting the light acceptable means under the light acceptable state by providing the free charges to the light acceptable means after the end of the light accepting period.

In the solid state imaging device according to the above mentioned embodiment, the incident light is accepted under the state in which the light acceptable means is filled with the free electrons during one light accepting period and, thereby, the solid state imaging device can be obtained signal charges under two states in which the free charges are generated based on the free-carrier absorption caused by the incident light and then partly remain free charges are left after the free charges are outputted from the photodiode.

Therefore the solid state camera device according to the above mentioned embodiments has a capability of a highly sensitivity. Accordingly, this invention provides a solid state imaging device having a high S/N ratio (signal-to-noise ratio).

These and other objects will become apparent from the following detailed description taken in connection with the accompanying drawings.

DETAILED DESCRIPTION OF THE EMBODIMENTS

Embodiments of the invention will now be described with reference to drawings.

Figure 3:
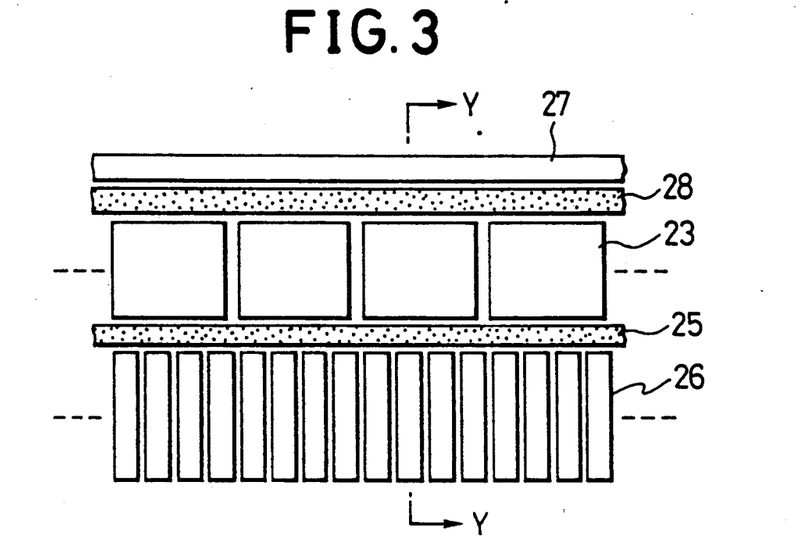
FIG. 3 is a plane view showing a solid state imaging device according to an embodiment of this invention.
Figure 4A:
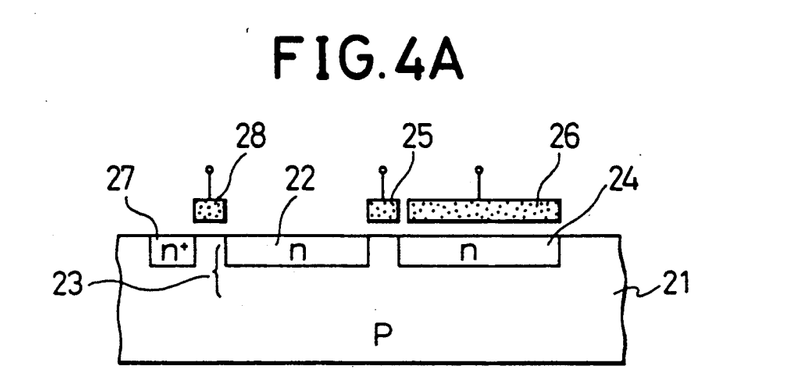
FIG. 4A is a cross sectional view along the Y—Y line in the solid state imaging device as shown in FIG. 3.
Figure 4B:
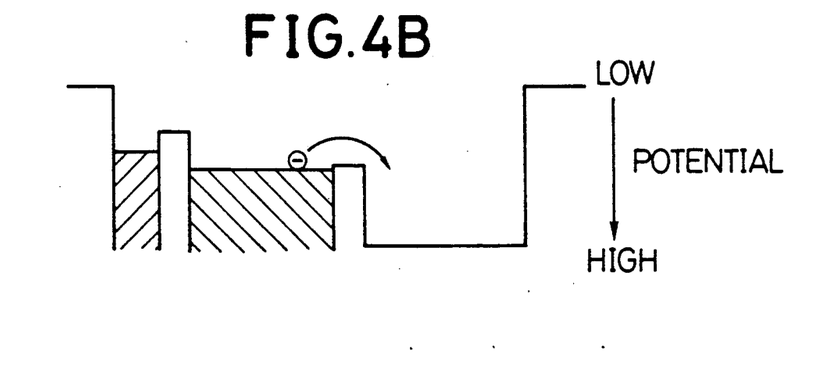
FIG. 4B is a potential energy view of the solid state imaging device as shown in FIG. 4A.

FIG. 3 is a plan view showing a composition of a semiconductor device according to the first embodiment of this invention. FIG. 4A is a cross sectional view along the Y—Y line of the solid state device as shown in FIG. 3. FIG. 4B is a potential energy view of the solid state device as shown in FIG. 4A.

The solid state device of the embodiment as shown in FIGS. 3 and 4A is formed by photodiodes 23, channel regions 24, transfer electrodes 25 and transmission electrodes 26, like the conventional solid state camera device as shown in FIGS. 1 and 2A. In addition above mentioned composition, in the composition of the solid state device as shown in FIG. 3, by adding a third impurity region 27 (N+) of N-type having a predetermined interval between one side of a junction region of the photodiode 23 and the first impurity region 22 is formed on a surface portion of the substrate 21 as a setting means.

The third impurity region 27 is a source region for providing free charges to the first impurity region 22. An injection electrode 28 is formed on the substrate 21 between the source region 27 and the first impurity region 22. The injection electrode 28 performs as a gate electrode which controls free charges provided from the source region 27 to the photodiode 23. Namely, the injection electrode 28 controls free charges from the source region 27 to the first impurity region 22 by changing a potential between the source region 27 and the first impurity region 22 in accordance with a supplied voltage.

In the solid state device of the embodiment having the above mentioned composition, signal charges are in a state in which the photodiode 23 is filled with free charges sufficiently up to a voltage determined by a potential formed in the substrate 21 under the transfer electrodes 25.

Hereinafter, operation of the solid state device having the above composition will be described. FIGS. 5A to 5E are views for explaining the operation in which the solid state device accepts the incident light and then gets signal charges.

Figure 5A:
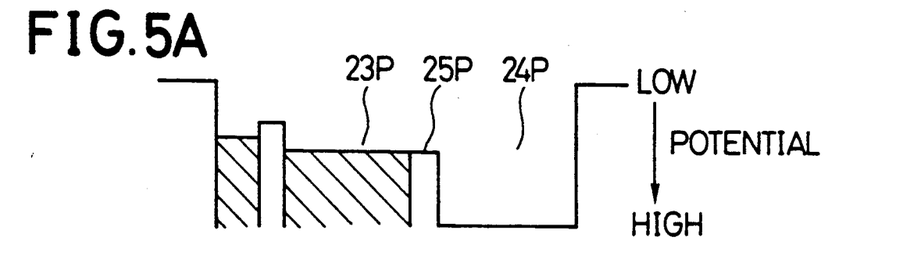
FIGS. 5A to 5E are views for explaining operation of the solid state imaging device as shown in FIG. 3.

In the FIGS. 5A to 5E, first the photodiode 23 is set to a state in which it is filled with free charges up to a voltage determined potential 25 P under the transfer electrode 25 by supplying a predetermined voltage to the transfer electrode 25. Although the state in which the potential 23 P is a potential filled perfectly with free charges up to a voltage determined a potential 25 P under the transfer electrode 25, the free charges are leaked into a potential 24 P of the channel region 24 over the potential 25 P by thermal vibration as thermal motion according to elapse of time, and thereby a voltage of the potential 23 P in the photodiode 23 is decreased in accordance with the leaked free charges. The decreased-voltage amount is proportional to temperature of the photodiode 23 and causes thermal noise by voltage on the order of 25 to 26 mV. In a very low-temperature of 77 K., thermal noises are caused by voltage on the order of 7 to 8 mV. In the above mentioned states, we define as the state (described above) in which the photodiode 23 is filled with free charges. Hereinafter the state is called as a light acceptable starting state (as shown in FIG. 5A).

In the above mentioned state, when the incident light is accepted by the photodiode 23, free charges in a conduction band in a N-type semiconductor are given energy by the photo-energy of the incident light. Namely, the energy of the free charge in the conduction band is increased by free-carrier absorption as plasma absorption. The free charges of the potential 23 P in the photodiode 23 are transferred into the channel region 24 having the potential 24 P over the potential 25 P under the transfer electrode 25.

The number of the free charges is an amount proportional to the intensity of the incident light accepted in the photodiode 23. The free charges transferred to the channel region 24 therefore may be considered an amount propotional to the signal charges accepted by the photodiode 23.

Figure 6:
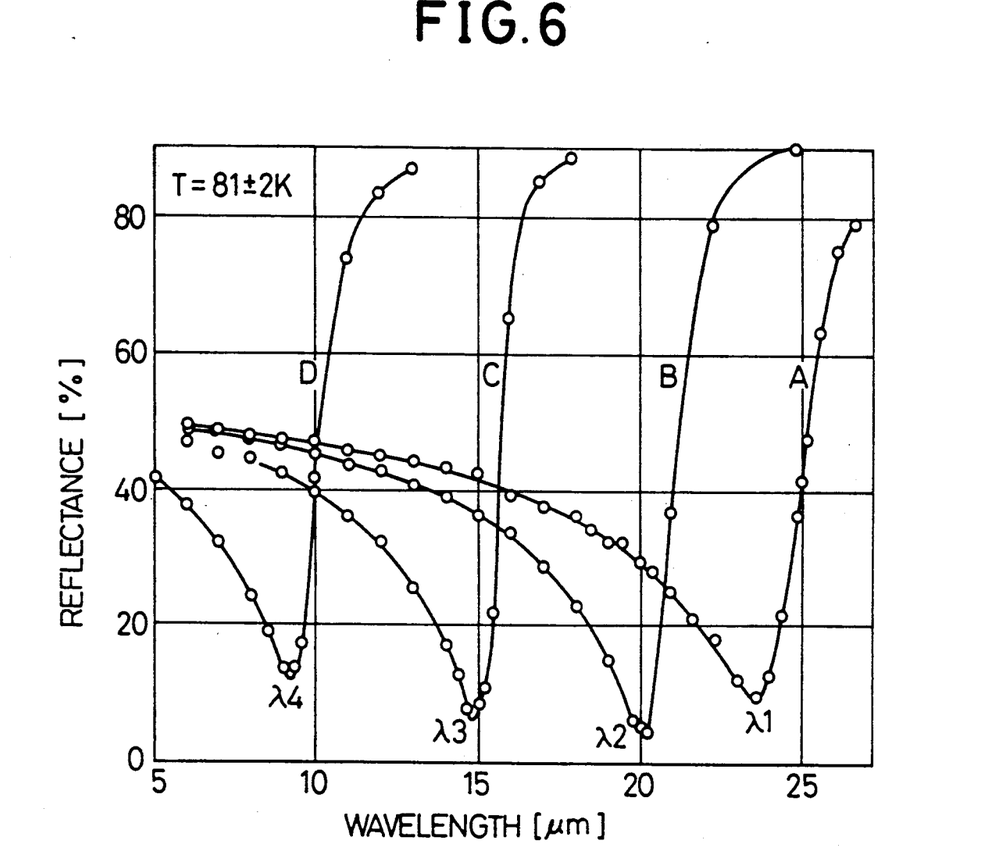
FIG. 6 is a view showing a relationship between wavelength of incident light incidenced in a photodiode formed by silicon and reflectance thereof.

FIG. 6 is a view showing the relationship between the incident light incident on the photodiode formed by silicon and a reflectance thereof. In the same Figure the plasma wavelength of a photodiode in which P (phoshorus) used in silicon is shown. The plasma wavelength is defined wavelength (showed as λ1, λ2, λ3 and λ4 in the drawing) as the most effective aborption in the photodiode.

Figure 7:
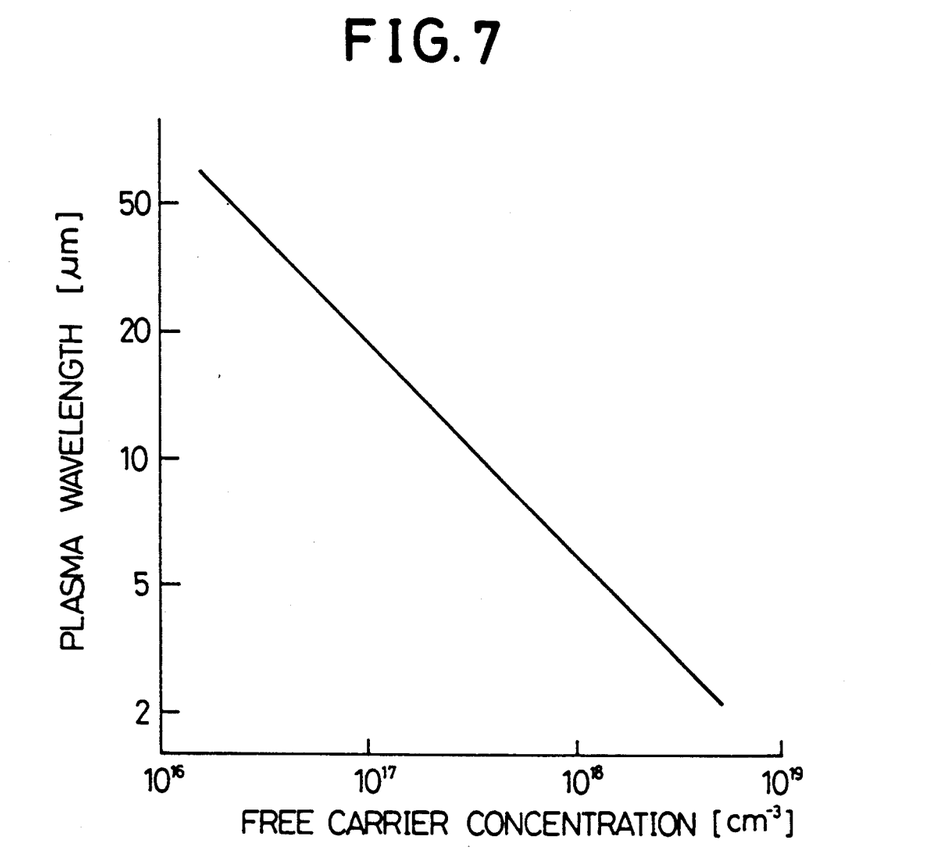
FIG. 7 is a view showing a relation between free-carrier concentration and plasma wavelength.

FIG. 7 shows a relationship between the plasma wavelength and free carrier concentration in silicon. In Figure, just as the FIG. 6, phosphorus is used in the photodiode as impurity. As shown in these Figures, the plasma wavelength is proportional to the amount of free carrier concentration. Accordingly the solid state camera device of the embodiment has an ability to detect wavelengths from 5 to 25 μm. In the solid state device of the embodiment, phosphorus is used in the photodiode as impurity. The invention is, however, not limited to this example, and same effect can also be achieved by using As(arsinic) or B(boron) as the impurity.

Figure 5B:
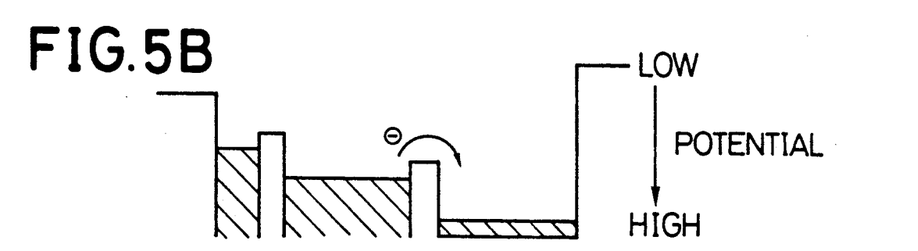
Figure 5C:
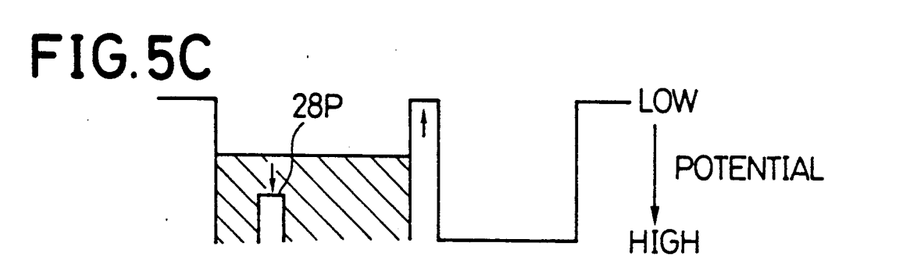
Figure 5D:
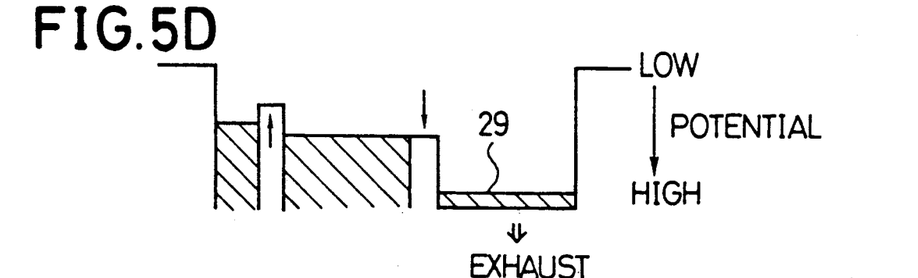

Next the voltage of the potential 25 P is decreased by removing a voltage to the transfer electrode 25. And then the signal charges transferred to the channel region 24 are read outside by supplying regularly the transfer signals to the transmit electrode 26. At the same time, as the above mentioned read-out operation, the injection electrode 28 is supplyed a voltage so that the potential 28 P is increased. Free carriers thereby are provided from the source region 27 to the photodiode 23. This means providing the free carriers to the photodiode 23 in which the number of the free carriers is decreased by transferring from the photodiode having a floating state to the channel region 24 over the potential under the transfer electrode 25 (FIG. 5C).

Figure 5E:
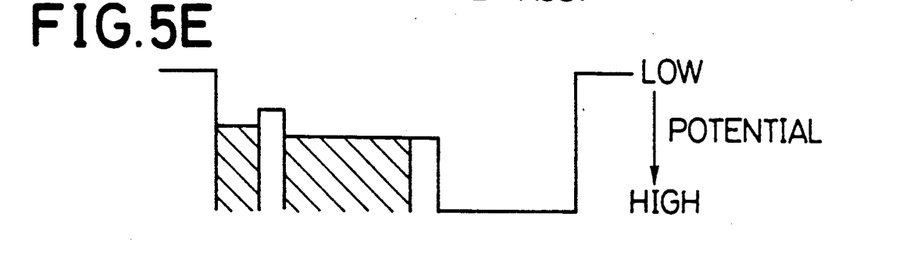

Next the injection electrode 28 and the potential under the transfer electrode 25 are returned to the potential as shown in FIG. 5A. Thereby the potential 23 P of the photodiode 23 is set at the voltage determined by the potential under the transfer electrode 25. Then the potential under the injection electrode 28 and the transfer electrode 25 are returned to the potential as shown FIG. 5A so that the rest of the free charges are exhausted from the photodiode 23 to the channel region 24 (see FIG. 5D). Next, for instance, the rest free charges exhausted to the channel region 24 are exhausted to an exhausted drain (not shown) and then the photodiode 23 is returned to the state as shown in FIG. 5A (FIG. 5E).

By performing the above mentioned operation repeatedly, free charges proportional to incident light can be generated and read out. The solid state device according to the embodiment operates by the above mentioned process. Therefore the solid state device of the embodiment can get free charges by plasma absorption, not just the fundamental absorption such as the conventional solid state camera device. Namely the photodiode 23 can get the signal charges proportional to incident light having energy smaller than the forbidden band of silicon comprising one side of a junction of the photodiode 23. The photodiode 23 can detect incident light having wavelength of more than 1.2 μm.

Figure 8:
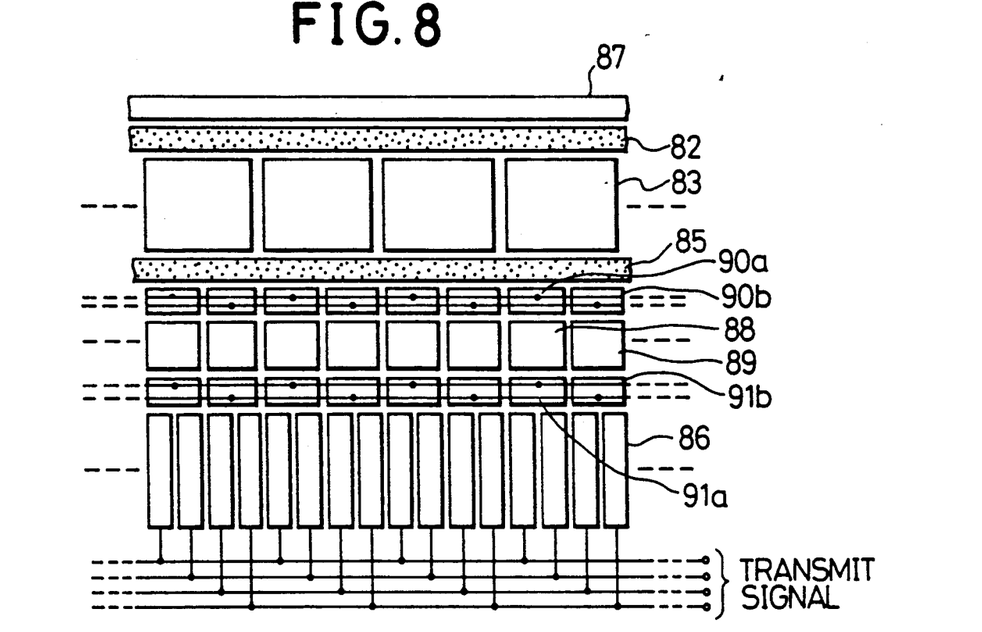
FIG. 8 is a plane view of a solid state device according to another embodiment of this invention.

FIG. 8 shows a plan view of a solid state imaging device according to an another embodiment. In addition to the composition of the solid state device according to the embodiment shown in FIG. 3, a feature of the embodiment is a composition formed of a first accumulation portion 88 as a first store means and a second accumulation portion 10 as a second store means between the transfer electrode 85 and the channel region (not shown: corresponding to the reference number 24 in FIG. 4A) under the transmit electrode 86. Moreover, they are formed in parallel with a photodiode 83 and between the input electrodes 90a, 90b and output electrodes 91a, 91b. Signal charges generated by plasma absorption (see FIG. 9A) are accumulated in the first accumulation portion 88 by applying a voltage to the input electrode 90a. Next signal charges having an inverse feature against the signal charges, which are accumulated in the second accumulation portion 89 generated by the plasma absorption, are accumulated in the second accumulation portion 89 by supplying a predetermined voltage to the inputted electrode 90b. Moreover, these signal charges accumulated in both accumulation portions 88 and 89 are read out by supplying a predetermined voltage to the output electrodes 91a and 91b so that signal charges proportional to the incident light are outputted.

Figure 9A:
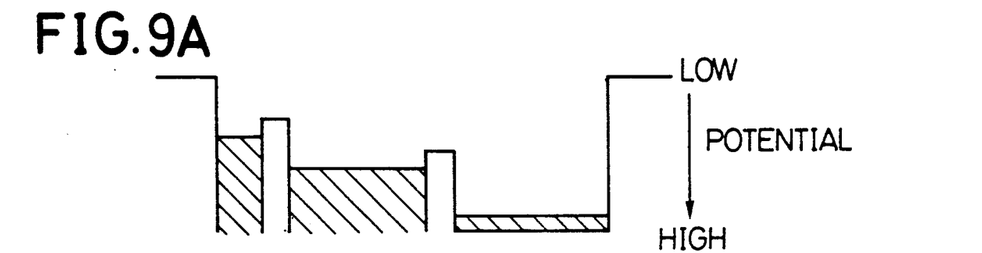
FIGS. 9A to 9C are views for explaining operation of the solid state device as shown in FIG. 8.
Figure 9B:
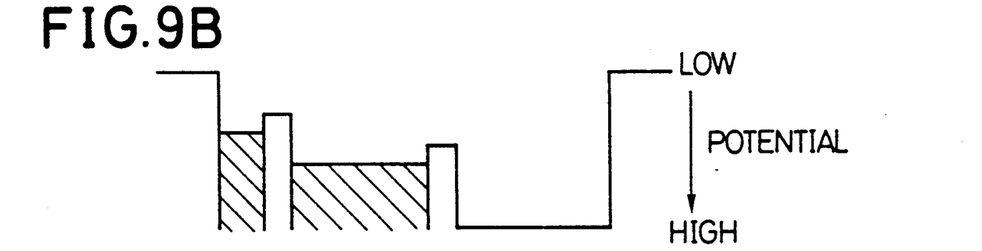
Figure 9C:
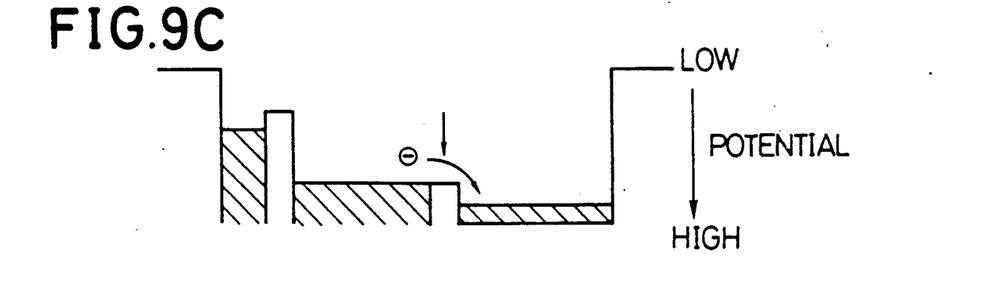

Hereinafter an operational method of the solid state imaging device according to the above mentioned embodiment will be explained. FIGS. 9A to 9C are potential energy view of the CCD according to the embodiment based on an operational method which is different from the operational method as shown in FIGS. 5A to 5E. The feature of the operational sequence of the embodiment as shown in FIGS. 5A to 5E is the free charges in the photodiode 23 are transferred to the channel region 24 by increacing the potential under the transfer electrode 25 by supplying higher voltage to the transfer electrode 25 after the signal charges are transferred from the photodiode 23 to the channel region 24 (FIG. 5A) and the signal charges transferred to the channel region 24 are read out (FIG. 5B).

In such a state, the free charges transferred to the channel region 24 after the potential under the transfer electrode 25 become signal charges having the inverse feature against the free charges transferred from the photodiode 23 to the channel region 24 and then read out.

Namely, in the solid state device according to the embodiment as shown in FIG. 8, two kinds of signal charges proportional to the incident light are used by accumulating the signal charges having a difference from each other, which are read out two times from the photodiode 83, to the first accumulation portion 88 and the second accumulation portion 89. These signal charges are read out from the transfer electrode 86 and then the predetermined operation is performed. Thereby S/N ratio(signal-to-noise ratio) can be improved. Accordingly, fine picture quality is achieved.

While, when the acceptable period is longer than a reading period for reading out the signal charge, by using the solid state camera device according to the embodiment, sensitivity and S/N ratio can be increased by performing many times the operational sequence in the first embodiment as shown in FIGS. 3 and 4. For example, the signal charges obtained from the photodiode 83 are accumulated in the first accumulation portion 88, and then the signal charges remained in the channel region are exhausted into the second accumuration protion 89. These operations are performed repeatedly during one light accepting period, and then the sum of the obtained accumulated signal charges is operated by the predetermined procedure. Thereby S/N ratio and sensitivity of the solid state imaging device can be increased to a very high level.

In the above mentioned embodiments of the solid state camera device, the source region, photodiode and channel regions are formed by N-type MOS transistor.

The scope of this invention is not limited to the preceding embodiments but includes many modification which the source region, photodiode region and channel region may be formed by P-type MOS transistor.

Various modifications will become possible for those skilled in the art, after receiving the teaching of the present disclosure, without departing from the scope thereof.

What is claimed is:

1. A solid state imaging device based on free carrier absorption, comprising:
    a light acceptable means for accepting incident light under a light acceptable state in which the light acceptable means is filled with free charges during a light accepting period and outputting signal charges as the free charges activated by energy based on free carrier absorption proportional to the amount of incident light;
    a store means for accumulating the signal charges outputted from the light acceptable means;
    a transfer means for reading out and transferring the signal charges in the store means; and
    a setting means for setting the light acceptable means in the light acceptable state by providing the free charges to the light acceptable means after the end of the light accepting period.

2. A solid state imaging device according to claim 1, wherein the light acceptable means exhausts a part of the free charges remaining therein.

3. A solid state camera device according to claim 1, wherein the light acceptable means, the store means, the transfer means and the setting means are formed on a silicon substrate.

4. A solid state camera device according to claim 1, wherein the light acceptable means, the store means, the transfer means and the setting means are formed by an N-type MOS transistor.

5. A solid state camera device according to claim 1, wherein the light acceptable means, the store means, the transfer means and the setting means are formed by P-type MOS transistor.

6. A solid state imaging device based on free carrier absorption, comprising:
    a light acceptable means for accepting incident light under a light acceptable state in which the light acceptable means is filled with free charges during a light accepting period, outputting a part of signal charge as the free charges activated by free carrier absorption proportional to the amount of the incident light, and exhausting a part of the free charges remaining therein;
    a first store means for accumulating the free charge outputted from the light acceptable means during the light accepting period;
    a second store means for accumulating the free charges exhausted from the light acceptable means after the end of the light accepting period;
    a transfer means for reading out and transferring the signal charges in the first store means and the second store means; and
    a setting means for setting the light acceptable means in the light acceptable state by providing free charges to the light acceptable means after end of the light accepting period.

7. A solid state camera device according to claim 6, wherein the light acceptable means, the first and second store means, the transfer means and the setting means are formed on a silicon substrate.

8. A solid state camera device according to claim 6, wherein the light acceptable means, the first and second store means, the transfer means and the setting means are formed by N-type MOS transistor.

9. A solid state camera device according to claim 6, wherein the light acceptable means, the first and second store means, the transfer means and the setting means are formed by P-type MOS transistor.

10. A signal charge processing method for a solid state imaging device based on free carrier absorption, comprising:
    accepting incident light under a light acceptable state in which a light acceptable means is filled with free charges during a light accepting period and outputting signal charges as the free charge activated by energy based on free carrier absorption proportional to amount of the incident light;
    accumulating the signal charges outputted from the light acceptable means;
    reading out and transferring the signal charges in the store means; and
    setting the light acceptable means in the light acceptable state by providing the free charges to the light acceptable means after the end of the light accepting period.

11. A signal charge processing method for a solid state imaging device based on free carrier absorption, comprising:
    accepting incident light under a light acceptable state in which a light acceptable means is filed with free charges during a light accepting period and outputting a part of the signal charge as the free charge activated by energy based on a free carrier absorption proportional to the amount of the incident light;
    accumulating the free charge outputted from a light acceptable means during the light acceptable period;
    accumulating the free charges exhausted from the light acceptable means after the end of the light acceptable period;
    reading out and transferring the signal charges in a first store means and a second store means; and
    setting the light acceptable means in the light acceptable state by providing the free charges to the light acceptable means after end of the light accepting period.

* * * * *